United States Patent
Zi et al.

(10) Patent No.: US 10,741,410 B2
(45) Date of Patent: Aug. 11, 2020

(54) MATERIAL COMPOSITION AND METHODS THEREOF

(71) Applicant: Taiwan Semiconductor Manufacturing Co., Ltd., Hsinchu (TW)

(72) Inventors: An-Ren Zi, Hsinchu (TW); Joy Cheng, Taoyuan (TW); Ching-Yu Chang, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 84 days.

(21) Appl. No.: 15/726,040

(22) Filed: Oct. 5, 2017

(65) Prior Publication Data
US 2018/0315617 A1   Nov. 1, 2018

Related U.S. Application Data

(60) Provisional application No. 62/491,383, filed on Apr. 28, 2017.

(51) Int. Cl.
| | | |
|---|---|---|
| H01L 21/3213 | (2006.01) | |
| C08F 12/08 | (2006.01) | |
| G03F 7/025 | (2006.01) | |
| G03F 7/027 | (2006.01) | |
| G03F 7/075 | (2006.01) | |
| G03F 7/004 | (2006.01) | |
| G03F 7/038 | (2006.01) | |
| G03F 7/029 | (2006.01) | |
| G03F 7/09 | (2006.01) | |
| G03F 7/033 | (2006.01) | |
| C08K 5/00 | (2006.01) | |
| C08K 3/011 | (2018.01) | |

(52) U.S. Cl.
CPC .......... *H01L 21/3213* (2013.01); *C08F 12/08* (2013.01); *G03F 7/0042* (2013.01); *G03F 7/025* (2013.01); *G03F 7/027* (2013.01); *G03F 7/029* (2013.01); *G03F 7/033* (2013.01); *G03F 7/038* (2013.01); *G03F 7/0752* (2013.01); *G03F 7/094* (2013.01); *C08K 3/011* (2018.01); *C08K 5/0025* (2013.01)

(58) Field of Classification Search
CPC ............. H01L 21/3213; H01L 21/0271; H01L 21/0273; H01L 21/312
See application file for complete search history.

(56) References Cited

U.S. PATENT DOCUMENTS

| | | | |
|---|---|---|---|
| 5,035,975 A * | 7/1991 | Takahashi | G03F 7/0285 264/4.32 |
| 8,796,666 B1 | 8/2014 | Huang et al. | |
| 9,012,132 B2 | 4/2015 | Chang | |

(Continued)

*Primary Examiner* — Christine A Enad
(74) *Attorney, Agent, or Firm* — Haynes and Boone, LLP (57) ABSTRACT

Provided is a material composition and method for that includes providing a substrate and forming a resist layer over the substrate. In various embodiments, the resist layer includes a metal complex including a radical generator, an organic core, and an organic solvent. By way of example, the organic core includes at least one cross-linker site. In some embodiments, an exposure process is performed to the resist layer. After performing the exposure process, the exposed resist layer is developed to form a patterned resist layer.

20 Claims, 8 Drawing Sheets

(56) References Cited

U.S. PATENT DOCUMENTS

| | | | |
|---|---|---|---|
| 9,028,915 B2 | 5/2015 | Chang et al. | |
| 9,093,530 B2 | 7/2015 | Huang et al. | |
| 9,146,469 B2 | 9/2015 | Liu et al. | |
| 9,213,234 B2 | 12/2015 | Chang | |
| 9,223,220 B2 | 12/2015 | Chang | |
| 9,256,133 B2 | 2/2016 | Chang | |
| 9,310,684 B2 * | 4/2016 | Meyers | G03F 7/0042 |
| 9,536,759 B2 | 1/2017 | Yang et al. | |
| 9,548,303 B2 | 1/2017 | Lee et al. | |
| 9,929,012 B1 * | 3/2018 | Belyansky | G03F 7/00 |
| 2004/0253540 A1 * | 12/2004 | Yoshida | G03F 7/322 430/281.1 |
| 2013/0189533 A1 * | 7/2013 | Okuyama | G03F 7/091 428/524 |
| 2014/0203400 A1 * | 7/2014 | Kobrinsky | H01L 27/224 257/532 |
| 2014/0370684 A1 * | 12/2014 | Khurana | H01L 21/76816 438/386 |
| 2015/0056542 A1 * | 2/2015 | Meyers | G03F 7/0042 430/9 |
| 2015/0056555 A1 * | 2/2015 | Lin | H01L 21/271 430/285.1 |
| 2015/0079393 A1 * | 3/2015 | Freedman | G03F 7/0042 428/402 |
| 2016/0116839 A1 | 4/2016 | Meyers et al. | |
| 2017/0146909 A1 * | 5/2017 | Smith | G03F 7/2004 |
| 2018/0101094 A1 * | 4/2018 | Hatakeyama | G03F 7/322 |

* cited by examiner

MATERIAL COMPOSITION AND METHODS THEREOF

CROSS-REFERENCE TO RELATED APPLICATION

This application claims the benefit of U.S. Provisional Application No. 62/491,383, filed Apr. 28, 2017, the entirety of which is incorporated by reference herein.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Generally, the minimum feature size of a given semiconductor IC is a function of the wavelength of a radiation source used in a lithography process, as well as a resist composition and resist selectivity, among other factors. As semiconductor lithography has progressed, the wavelength of the radiation source used has decreased, and the radiation source itself may be relatively weak, such that photoresists have been designed to utilize radiation sources as efficiently as possible. As one example, chemically amplified photoresist (CAR) compositions have been introduced in an effort to increases a resist's sensitivity to an exposing light source. However, CAR systems have encountered limitations which are difficult to overcome, such as poor photon absorption in thin films, moderate etch selectivity, and limited gains in resolution. Moreover, the need for photoresists with high resolution, low line width roughness (LWR), and high sensitivity has increased more rapidly than the capability provided by such CAR systems. As such, chemically amplified resists may not be able to satisfy the next generation lithography requirements demanded by the continued advances in semiconductor technology.

Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for semiconductor device fabrication, and more particularly to photoresist (resist) material compositions and/or complexes in extreme ultraviolet (EUV) lithography and methods of using the same. In some cases, the embodiments shown and described herein may also be used for deep UV (DUV) and electron beam (e-beam) lithography. Additionally, the various embodiments presented herein may be used to increase a resist sensitivity (e.g., to a DUV, UV, or e-beam radiation source). Generally, lithographic patterning includes coating a substrate with a resist film, exposing the resist film to a radiation source (e.g., DUV, UV, or e-beam radiation source), and developing the exposed resist in a developer (a chemical solution). The developer removes portions of the exposed resist, such as exposed portions of a positive-tone resist or unexposed portions of a negative-tone resist, thereby forming a patterned resist layer. The patterned resist layer may then be used as an etch mask in a subsequent etching processes, transferring the pattern of the patterned resist layer to an underlying material layer. Alternatively, the resist pattern is used as an ion implantation mask in a subsequent ion implantation process applied to the underlying material layer, such as an epitaxial semiconductor layer.

Generally, the minimum feature size of a given semiconductor IC is a function of the wavelength of the radiation source used in the lithography process, as well as the resist composition and resist selectivity, among other factors. As semiconductor lithography has progressed, the wavelength of the radiation source used has decreased, for example from 248 nm (e.g., for a KrF laser) to 193 nm (e.g., for an ArF laser) for DUV lithography, and to 13.5 nm for EUV lithography. Radiation sources (light sources) used to produce these wavelengths of light may be relatively weak, such that photoresists have been designed to utilize these light sources as efficiently as possible. Conventionally, this goal has been achieved in part by the use of chemically amplified photoresists, where such chemical amplification increases a resist's sensitivity to the exposing light source. Currently, most semiconductor companies use chemically amplified resists (CAR) for high-volume manufacturing (HVM). Chemically amplified resists have been used for 248 nm (e.g., for a KrF laser) and 193 nm (e.g., for an ArF laser) DUV lithography, as well as for 13.5 nm EUV lithography, but the need for photoresists with high resolution, low line width roughness (LWR), and high sensitivity has increased more rapidly than the capability provided by such resist systems. As such, chemically amplified resists may not be able to satisfy next generation lithography requirements. Generally, chemically amplified resist systems have encountered limitations which are difficult to overcome, such as poor photon absorption in thin films, moderate etch selectivity, and limited gains in resolution. For example, in EUV chemically amplified resists, there is no high EUV absorption element in the composition of the EUV CAR. Therefore, the sensitivity of an EUV CAR may be low. While there may still be ways in which to improve resist sensitivity, LWR and resolution may suffer due to the "RLS tradeoff", which states that it is very difficult to simultaneously improve resolution, LWR, and sensitivity.

Embodiments of the present disclosure offer advantages over the existing art, though it is understood that other embodiments may offer different advantages, not all advantages are necessarily discussed herein, and no particular advantage is required for all embodiments. Generally, and in accordance with embodiments disclosed herein, a better way to improve resist performance by using lithography light sources (e.g., EUV light) more efficiently is provided. For example, in some embodiments, a novel metallic resist (e.g., such as an EUV resist) is provided, where the metallic resist provides for improved light absorption (e.g., EUV light absorption) of the resist. In some embodiments, the metallic resist disclosed herein includes at least a metallic radical generator, an organic core with one or more cross-linker sites, and an organic solvent. In some examples, the disclosed resist includes the metallic radical generator which could be a single metal molecule, or a metal cluster with a radical generator function. In some embodiments, a weight ratio of the metallic radical generator to the solvent may be around 1%~20%. In some cases, the disclosed resist includes the organic core having at least one cross-linker site, where a weight ratio of the organic core to the solvent may be around 3%~35%. In some embodiments, the disclosed resist may include a metallic core within the cross-linker site and/or within the radical generator site. By way of example, a weight ratio of the metallic core to the solvent may be around 3%~30%. In some embodiments, the metallic resist disclosed herein includes an organic solvent such as PGMEA (Propylene glycol methyl ether acetate), PGME (propylene glycol monomethyl ether), PGEE (1-Ethoxy-2-propanol), GBL (Gamma-Butyrolactone), CHN (Cyclohexanone), EL (Ethyl lactate), Methanol, Ethanol, Propanol, n-Butanol, Acetone, DMF (Dimethylformamide), IPA (Isopropyl alcohol), THF (Tetrahydrofuran), Methyl Isobutyl Carbinol (MIBC), or other suitable solvent. In some embodiments, after exposure of the metallic resist (e.g., including a DUV or EUV exposure with a wavelength <100 nm), the metallic radical generator may generate radicals to induce a cross-linking reaction. By way of example, the organic core may thus become cross-linked and un-soluble, while non-exposed portions of the resist may be soluble in a developer. In some embodiments, the metallic resist disclosed herein may be applied to processes having a pattern pitch of less than about 40 nm. In some cases, the LWR and exposure energy for the disclosed resist may be about less than 5 nm and less than 40 mJ, respectively.

It is also noted that the material compositions, metal complexes, and methods of the present disclosure are not limited to a particular substrate type, mask type, resist type, radiation source (e.g., radiation wavelength), and/or lithography system type. For example, the material compositions, metal complexes, and methods may be applied to features and/or devices patterned on a variety of substrate materials such as silicon, germanium, silicon carbide (SiC), silicon germanium (SiGe), diamond, compound semiconductors, alloy semiconductors, and the substrate may optionally include one or more epitaxial layers (epi-layers), may be strained for performance enhancement, may include a silicon-on-insulator (SOI) structure, and/or have other suitable enhancement features. Embodiments of the present disclosure may further be applicable to processes employing reflective masks (e.g., such as used for extreme ultraviolet (EUV) lithography), transmissive masks, binary intensity masks, phase-shifting masks, as well as other mask types known in the art. In some examples, embodiments disclosed herein may be applied to processes employing various types of resist such as poly(methyl methacrylate) (PMMA), SU-8, an EUV resist, a positive-tone resist, a negative-tone resist, or other types of resist as known in the art. Additionally, embodiments of the present disclosure are applicable to various lithography system/aligner types such as a contact aligner, a proximity aligner, a projection aligner, or an EUV lithography system. Thus, embodiments of the present disclosure may further be applicable to systems employing any of a variety of radiation sources (radiation wavelengths) such as UV light, deep UV (DUV) light, EUV light, or other radiation sources as known in the art.

Figure 1:
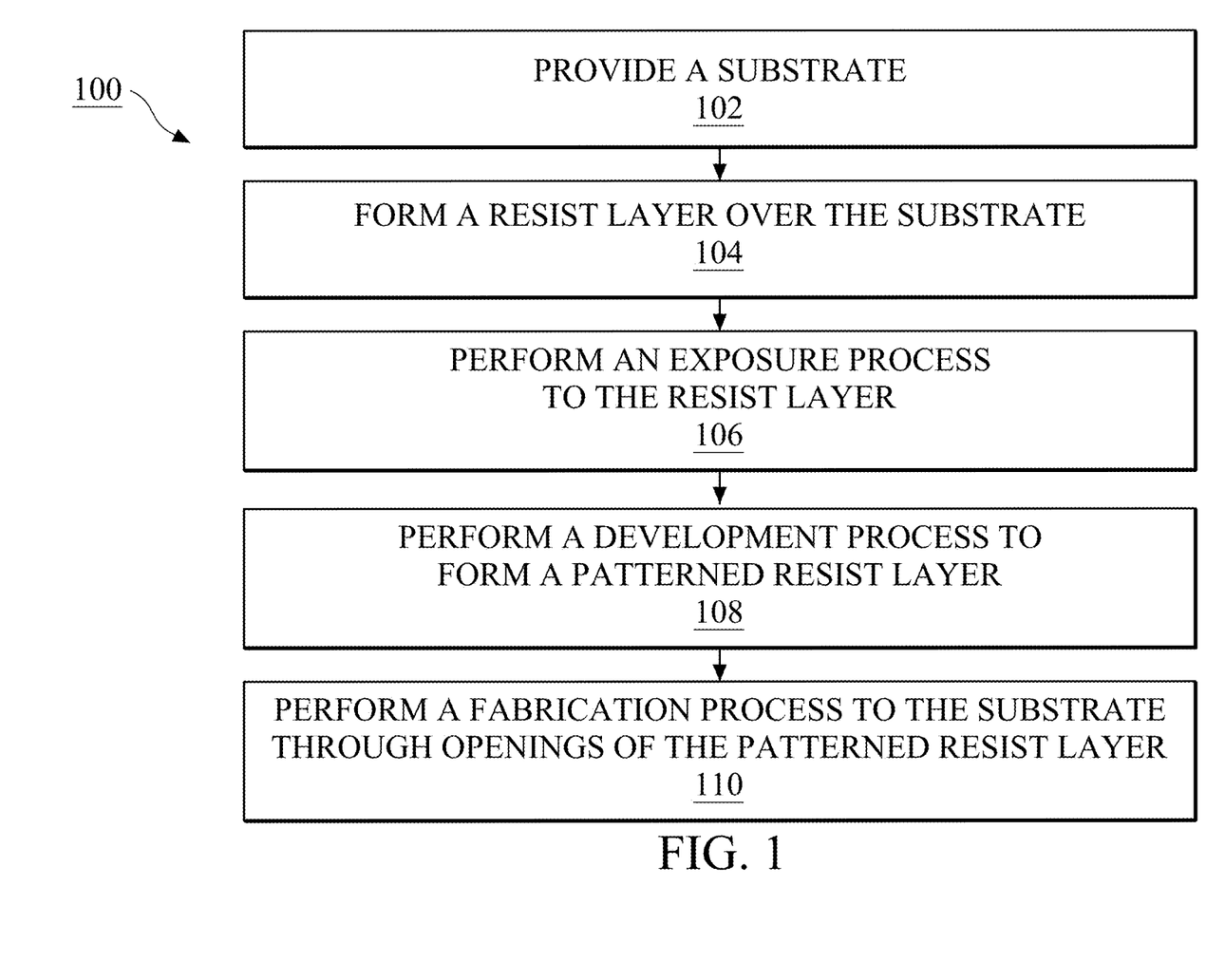
FIG. 1 illustrates a flow chart of a method for patterning a substrate, according to various embodiments.

Referring first to FIG. 1, illustrated therein is a flow chart of a method 100 for patterning a substrate (e.g., a semiconductor wafer), according to various embodiments. The method 100 may be implemented, in whole or in part, by a system employing advanced lithography processes such as deep ultraviolet (DUV) lithography, extreme ultraviolet (EUV) lithography, electron beam (e-beam) lithography, X-ray lithography, and/or other lithography processes to improve pattern dimension accuracy. In the present embodiment, EUV and/or e-beam lithography is used as the primary example. It is understood that additional operations can be provided before, during, and after the method 100, and some operations described can be replaced, eliminated, or moved around for additional embodiments of the method. It is also noted that the method 100 is exemplary, and is not intended to limit the present disclosure beyond what is explicitly recited in the claims that follow. The method 100 will be further described below in conjunction with FIGS. 2A, 2B, 2C, 2D, and 2E.

In particular, FIGS. 2A, 2B, 2C, 2D, and 2E provide cross-sectional views of a semiconductor structure 200 at various fabrication stages, constructed in accordance with some embodiments. The method 100 is described below in conjunction FIGS. 2A, 2B, 2C, 2D, and 2E, where the semiconductor structure 200 is fabricated by using embodiments of the method 100. The semiconductor device 200 may be an intermediate device fabricated during processing of an IC, or a portion thereof, that may include logic circuits, memory structures, passive components (such as resistors, capacitors, and inductors), and active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

The method 100 begins at block 102 where a substrate is provided. With reference to the example of FIG. 2A, in an embodiment of block 102, illustrated therein is a cross-section view of the semiconductor structure 200 including a substrate 202. In some embodiments, the substrate 202 may include a semiconductor substrate, as described above, and the substrate 202 may include various layers, including conductive or insulating layers formed on the substrate 202, an organic layer, and/or various enhancement features, as previously described. The substrate 202 may also include various doping configurations depending on design requirements as is known in the art.

Figure 2A:
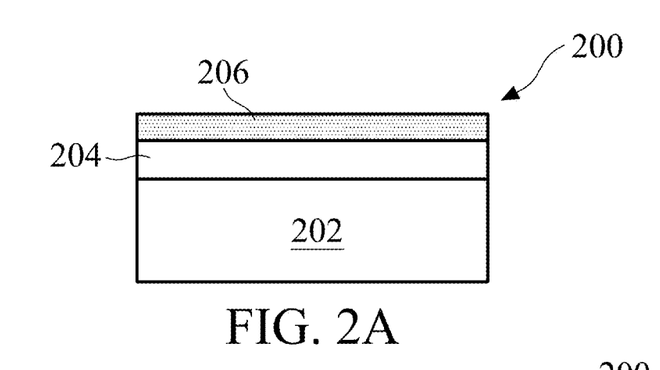
FIGS. 2A, 2B, 2C, 2D, and 2E provide cross-sectional views of a semiconductor structure 200 at various fabrication stages, constructed in accordance with the method of FIG. 1.
Figure 2B:
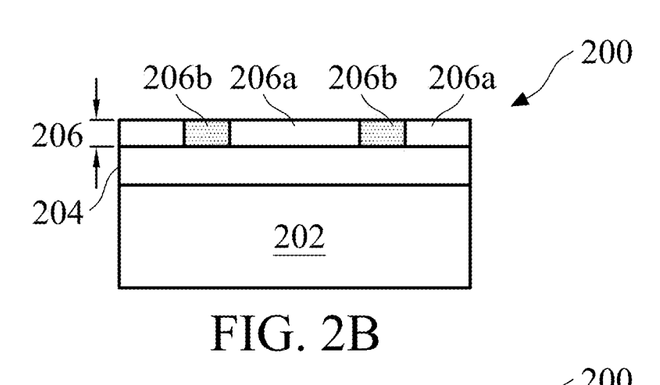

In some embodiments, the substrate 202 includes an underlayer (or material layer) 204 to be processed, such as to be patterned or to be implanted. For example, the underlayer 204 may include a hard mask layer to be patterned. In some cases, the underlayer 204 may include an epitaxial semiconductor layer to be ion implanted. However, in some embodiments, the substrate 202 may not include an underlayer and an underlayer (e.g., 204) is instead optionally formed over the substrate 202. In an embodiment, the underlayer 204 may include a hard mask layer including material(s) such as silicon oxide, silicon nitride (SiN), silicon oxynitride, titanium nitride, or other suitable material or composition. In some embodiments, the underlayer 204 may include an anti-reflection coating (ARC) layer such as a nitrogen-free anti-reflection coating (NFARC) layer including material(s) such as silicon oxide, silicon oxygen carbide, or plasma enhanced chemical vapor deposited silicon oxide. In various embodiments, the underlayer 204 may include a high-k dielectric layer, a gate layer, a hard mask layer, an interfacial layer, a capping layer, a diffusion/barrier layer, a dielectric layer, a conductive layer, other suitable layers, and/or combinations thereof.

In some embodiments, the structure 200 may alternatively include a mask used to pattern a semiconductor wafer. Thus, in some embodiments, the substrate 202 may include a mask substrate that may include a transparent material (such as quartz), or a low thermal expansion material such as silicon oxide-titanium oxide compound. The mask substrate 202 may further include a material layer to be patterned. In furtherance of this example, the substrate 202 may include a mask substrate for making a deep ultraviolet (DUV) mask, an extreme ultraviolet (EUV) mask, or other types of masks. Accordingly, in some embodiments, the underlayer 204 may include a material layer to be patterned to define a circuit pattern. For example, the underlayer 204 may include an absorber layer, such as a chromium layer.

The method 100 proceeds to block 104 where a photoresist layer (or simply resist layer) 206 is formed over the substrate 202, or over the optional underlayer 204 (FIG. 2A). In various examples, the resist layer 206 includes a metallic resist, in accordance with the embodiments described herein. The resist layer 206 is sensitive to radiation used in a lithography exposure process and has a resistance to etching processes (or ion implantation processes). In comparison to at least some current resist compositions, and as described in more detail below, the metallic resist layer 206 provides a resist (e.g., an EUV resist) having improved DUV or EUV absorption sensitivity. In some embodiments, the resist layer 206 may be formed by a spin-on coating process. In some examples, prior to forming the resist layer 206, an adhesion layer (e.g., such as an HMDS layer) is formed over the substrate 202, or over the optional underlayer 204. In some embodiments, after formation of the resist layer 206, and prior to performing an exposure process, a pre-bake process may be performed, for example, to evaporate solvents and to densify the resist layer 206. In various embodiments, the resist layer 206 is sensitive to various types of radiation, such as DUV radiation (e.g., 248 nm radiation from a KrF laser or 193 nm radiation from an ArF laser), EUV radiation (e.g., 13.5 nm radiation), an electron beam (e-beam), or an ion beam. For purposes of the present example, the resist layer 206 is sensitive to EUV radiation. Details of various aspects of the resist layer 206 are discussed and/or illustrated in more detail below with respect to FIGS. 3-9. In some examples, the resist layer 206 is soluble in a positive tone developer or negative tone developer after being exposed by EUV radiation.

The method 100 proceeds to block 106 where a pattern is exposed onto the resist-coated substrate. With reference to the example of FIG. 2B, in an embodiment of block 106, illustrated therein is a cross-section view of the structure 200, where the resist layer 206 (FIG. 2A) has been exposed (e.g., by a lithographic imaging system) through an intervening mask. In some embodiments, the resist layer 206 is exposed by EUV radiation (e.g., 13.5 nm). Alternatively, in some embodiments, the resist layer 206 may be exposed by DUV radiation (e.g., from a 248 nm KrF excimer laser or a 193 nm ArF excimer laser), X-ray radiation, an e-beam, an ion beam, and/or other suitable radiation sources. In various examples, the exposure of block 106 may be performed in air, in a liquid (e.g., immersion lithography), or in a vacuum (e.g., for EUV lithography and e-beam lithography). In some embodiments, the radiation beam is patterned with a mask, such as a transmissive mask or a reflective mask, which may include resolution enhancement features such as phase-shifting features and/or optical proximity correction (OPC), and which may be performed using off-axis illumination (OAI). In some other embodiments, the radiation beam is directly modulated with a predefined pattern, such as an IC layout, without using a mask (such as using a digital pattern generator or direct-write mode). In the present example, the radiation beam includes EUV radiation and the exposure of block 106 is performed in an EUV lithography system.

In some embodiments, after the exposure of block 106, a baking process may be performed. For example, in some embodiments, after exposure of the resist layer 206, and prior to performing a resist development process, a post-bake process may be performed to stabilize and harden the developed resist layer. In some examples, As a result of the exposure process of block 106, a latent pattern is formed in the resist layer 206. By way of example, the latent pattern refers to the exposed pattern on the resist layer 206, which will subsequently become a physical resist pattern, after a developing process. In various embodiments, the latent pattern of the resist layer 206 may include unexposed portions 206a and exposed portions 206b. In various embodiments, the exposed portions 206b of the resist layer 206 may be physically or chemically changed as a result of the exposure process of block 106. Additional details of how the resist layer 206 changes, in view of the exposure of block 106, are discussed below (e.g., with reference to FIGS. 3-9). In some embodiments, if a positive-tone resist has been used, the exposed portions 206b will be dissolved during a subsequent development process. In some cases, if a negative-tone resist has been used, the exposed portions 206b will become insoluble and a subsequent development process may instead dissolve the unexposed portions 206a.

The method 100 proceeds to block 108 where a development process is performed to form a patterned resist layer. With reference to the example of FIGS. 2B and 2C, in an embodiment of block 108, after formation of the latent image, including the unexposed and exposed portions 206a/206b, a resist development process is performed, resulting in a patterned resist layer 206'. In some embodiments, the resist development process includes a wet chemical development process, as known in the art. As discussed above, if a negative-tone resist has been used, the exposed portions 206b will become insoluble. Thus, referring to the example of FIG. 2C which shows the structure 200 after a development process, use of a negative-tone resist is illustrated.

Figure 2C:
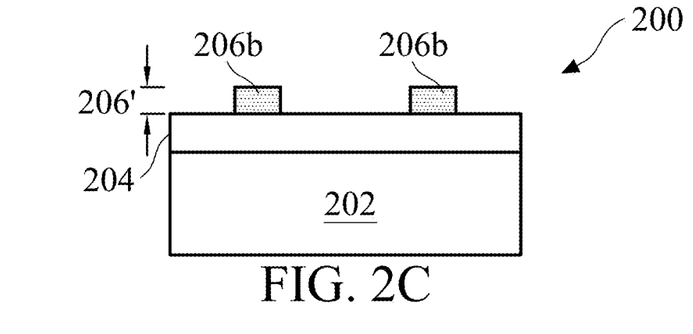
Figure 2D:
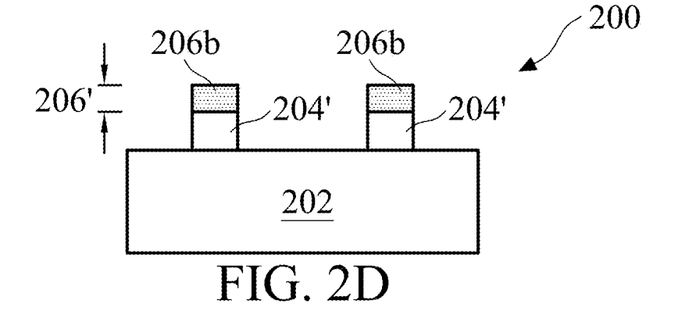

The method 100 proceeds to block 110, where a fabrication process is performed to the substrate through openings of the patterned resist layer. For example, a fabrication process may be performed to the semiconductor structure 200 using the patterned resist layer 206' as a mask, such that the fabrication process is applied to the portions of the semiconductor structure 200 within the openings of the patterned resist layer 206' (e.g., the exposed regions of the underlayer 204), while other portions covered by the patterned resist layer 206' are protected from the fabrication process. In some embodiments, the fabrication process of block 110 may include an etching process applied to the underlayer 204 using the patterned resist layer 206' as an etch mask, thereby transferring the pattern from the patterned resist layer 206' to the underlayer 204. Alternatively, in some embodiments, the fabrication process of block 110 may include an ion implantation process applied to the semiconductor structure 200 using the patterned resist layer 206' as an ion implantation mask, thereby forming various doped features in the semiconductor structure 200 (e.g., within the underlayer 204).

Figure 2E:
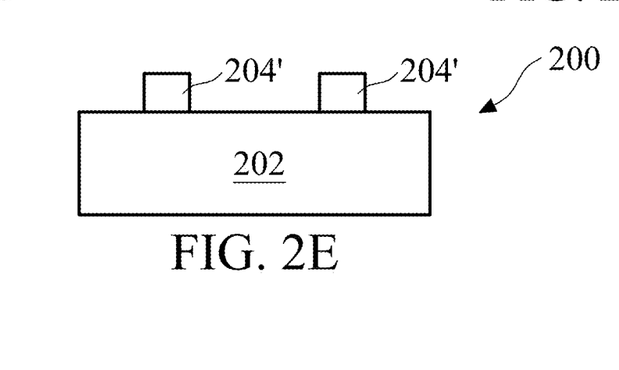

As described above, and in the present examples, the underlayer 204 may include a hard mask layer. In furtherance of this example, the pattern of the patterned resist layer 206' may first be transferred to the underlayer 204 (e.g., the hard mask layer 204), forming a patterned hard mask layer 204' (FIG. 2D), then to other layers of the substrate 202. For example, the hard mask layer 204 may be etched through openings of the patterned resist layer 206' using a dry (plasma) etching process, a wet etching process, a combination thereof, and/or other etching methods. For example, a dry etching process may include an oxygen-containing gas, a fluorine-containing gas, a chlorine-containing gas, a bromine-containing gas, an iodine-containing gas, other suitable gases and/or plasmas, and/or combinations thereof. In some embodiments, the patterned resist layer 206' may be partially or completely consumed during the etching of the hard mask layer 204 and formation of the patterned hard mask layer 204'. In an embodiment, any portion of the patterned resist layer 206' remaining after the etching process may be stripped off, leaving a patterned hard mask layer 204' over the substrate 202, as illustrated in FIG. 2E.

The method 100 may include other steps before, during or after the steps described above. In an embodiment, the substrate 202 is a semiconductor substrate and the method 100 proceeds to forming fin field effect transistor (FinFET) devices. In such an example, the method 100 may further include forming a plurality of active fins in the semiconductor substrate 202. Additionally, and in furtherance of this example, the block 110 may further include etching the substrate 202 through the openings of the patterned hard mask 204' to form trenches in the substrate 202; filling the trenches with a dielectric material; performing a chemical mechanical polishing (CMP) process to form shallow trench isolation (STI) features; epitaxial growth and/or recessing of the STI features to form fin-like active regions. In some embodiments, the method 100 includes other steps to form a plurality of gate electrodes, gate spacers, doped source/drain regions, contacts for gate/source/drain features, etc. In some embodiments, subsequent processing may form various contacts/vias/lines and multilayers interconnect features (e.g., metal layers and interlayer dielectrics) on the substrate, configured to connect the various features to form a functional circuit that may include one or more devices (e.g., one or more FinFET devices). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Figure 3:
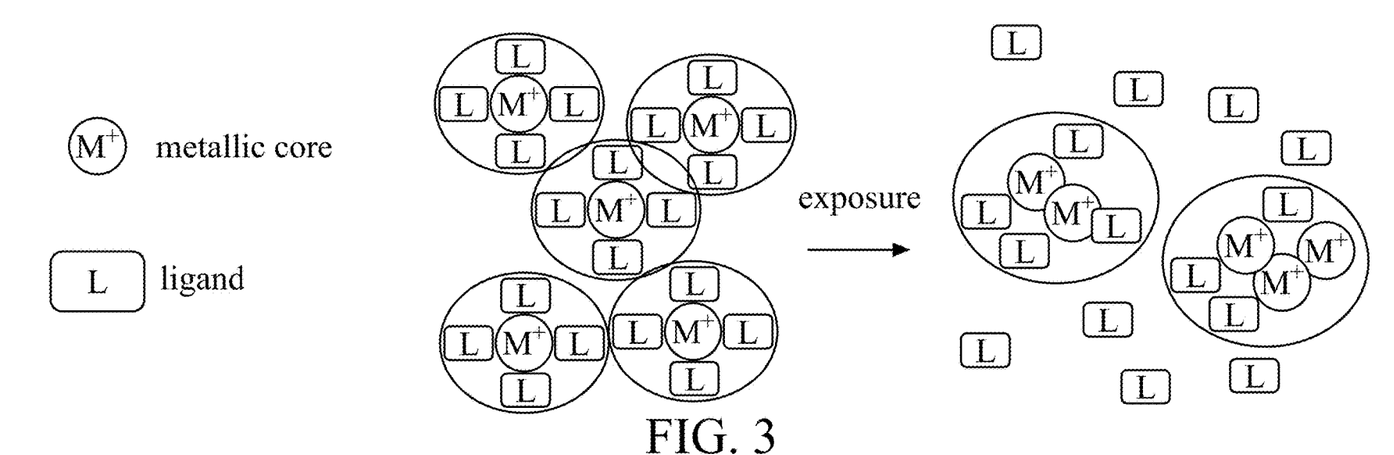
FIG. 3 illustrates a metal complex, according to some embodiments.
Figure 4:
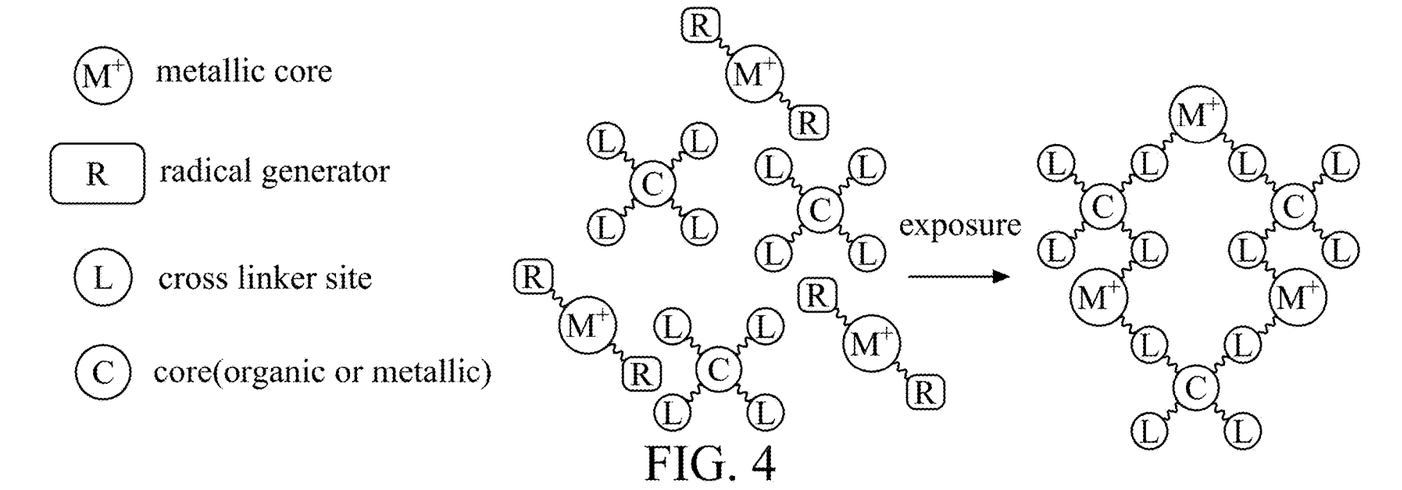
FIG. 4 illustrates a metal complex including metallic cores, radical generators, and cross-linker sites, according to some embodiments.
Figure 5:
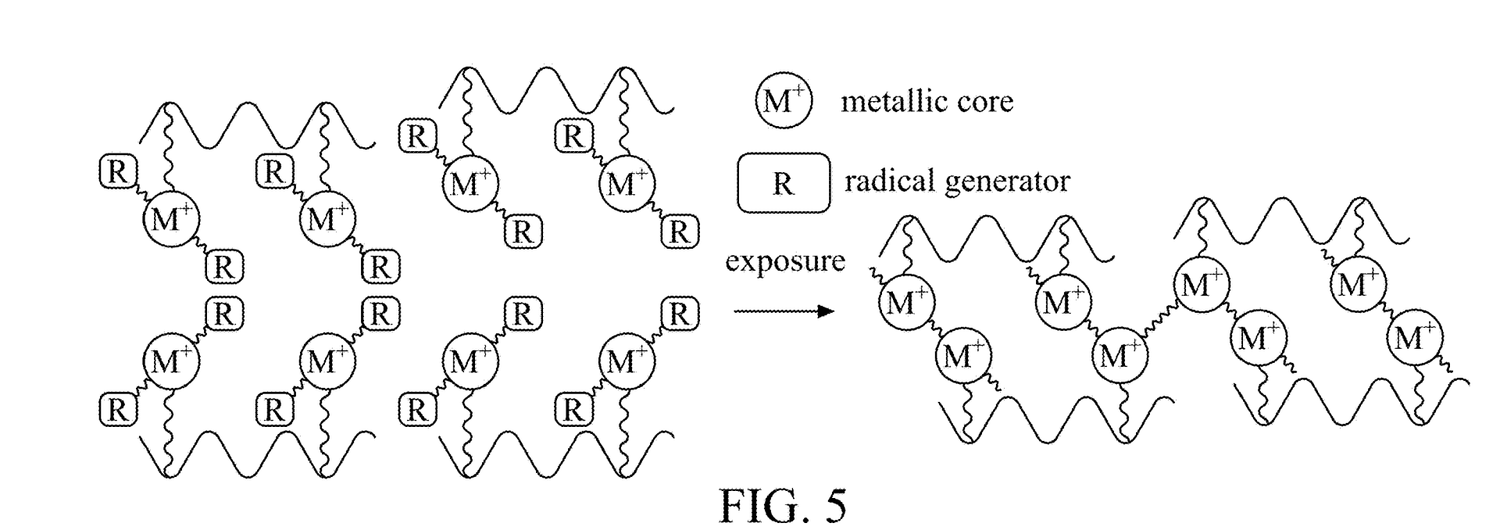
FIG. 5 illustrates a metal complex including metallic cores and radical generators coupled to polymers, according to some embodiments.
Figure 6:
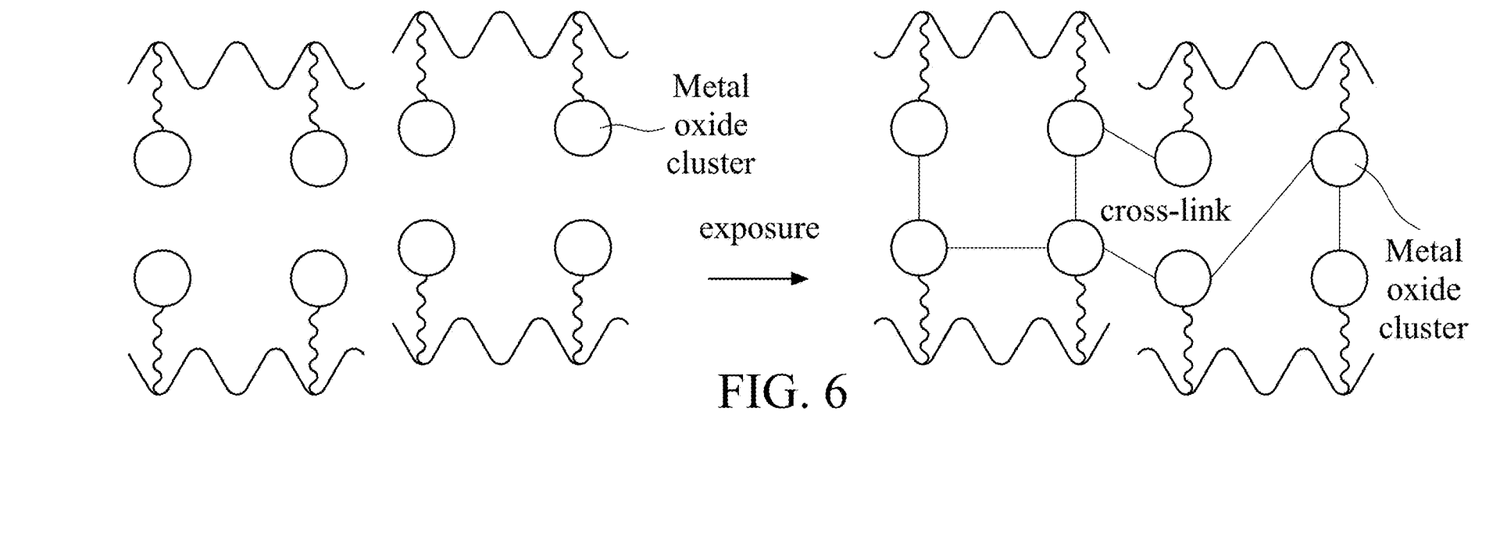
FIG. 6 illustrates a metal complex including metal oxide clusters coupled to polymers, according to some embodiments.
Figure 7A:
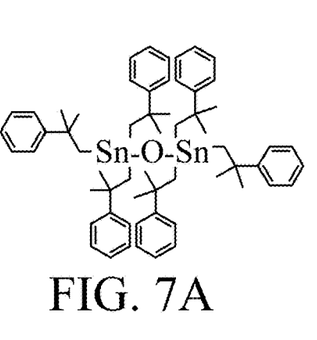
FIGS. 7A, 7B, 7C, 7D, 7E, 7F, 7G, 7H, 7I, 7J, 7K, and 7L provide various examples of molecular structures that may be used as part of a metal sensitizer, according to some embodiments.
Figure 7B:
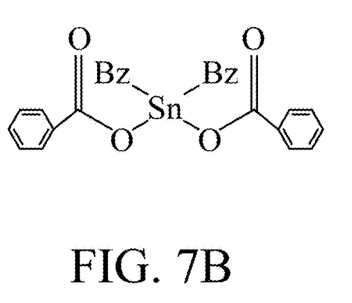
Figure 7C:
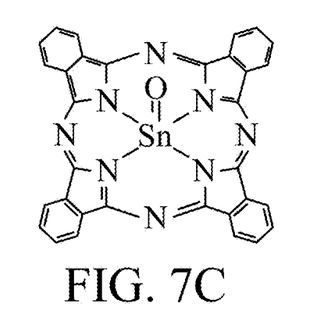
Figure 7D:
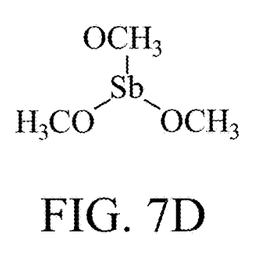
Figure 7E:
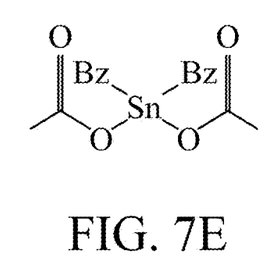
Figure 7F:
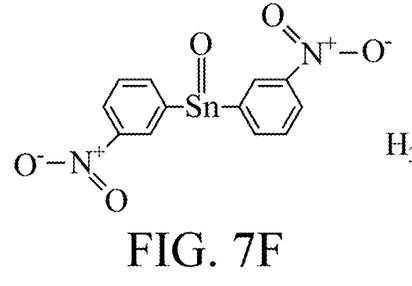
Figure 7G:
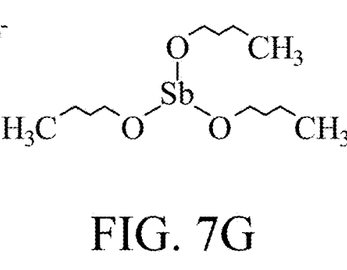
Figure 7H:
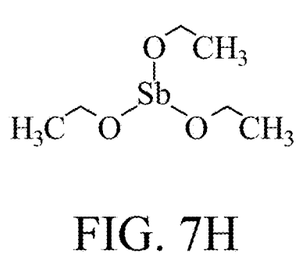
Figure 7I:
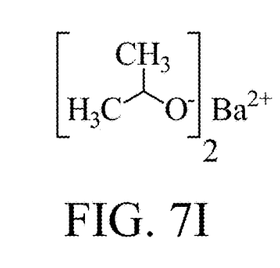
Figure 7J:
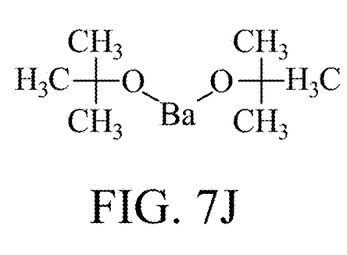
Figure 7K:
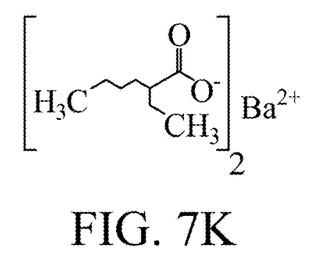
Figure 7L:
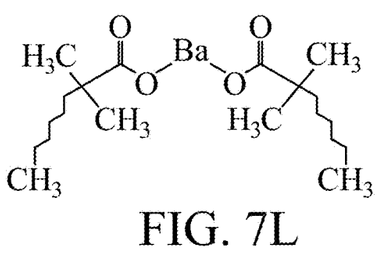
Figure 8A:
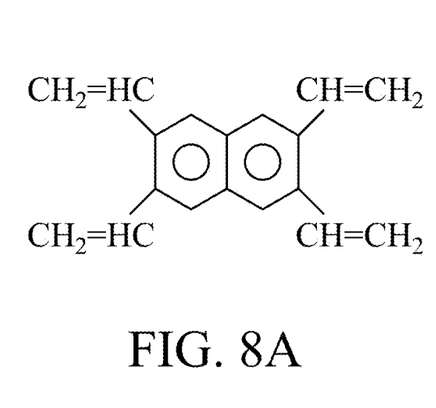
FIGS. 8A, 8B, 8C, 8D, 8E, and 8F provide various examples of molecular structures that may be used as part of an organic core with cross-linker site, according to some embodiments.
Figure 8B:
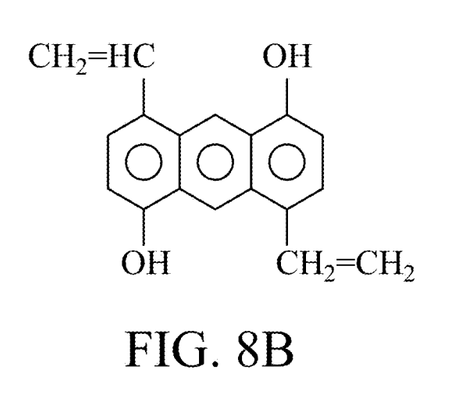
Figure 8C:
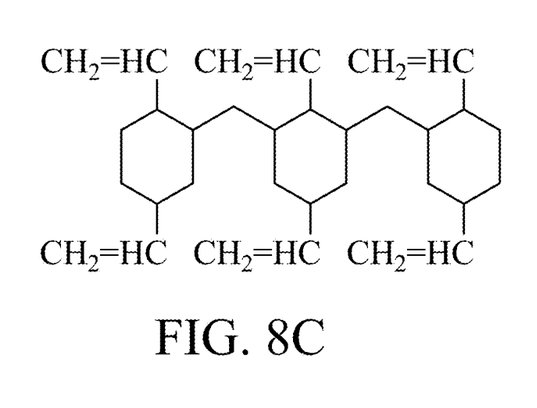
Figure 8D:
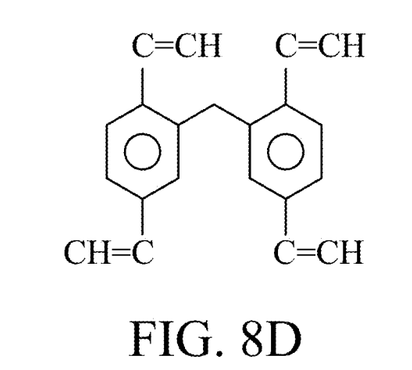
Figure 8E:
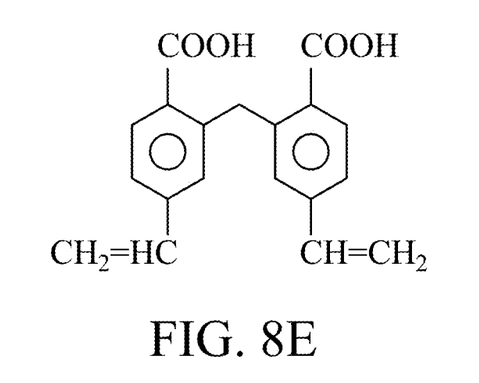
Figure 8F:
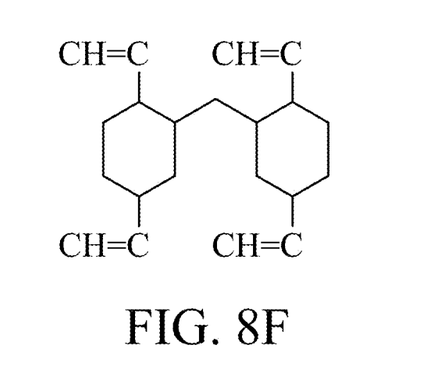

Referring now to FIGS. 3-9, illustrated therein are some embodiments of metal complexes used for the resist layer 206, which is some cases may be referred to as metal resist complexes. In various embodiments, the metal resist complexes provide an EUV resist, and as such, are sensitive to radiation such as EUV radiation. In particular, it is noted that the reactions illustrated may be catalyzed by EUV radiation, or in some cases other types of radiation such as DUV, e-beam, X-ray, ion beam, or other type of radiation. In some embodiments, the resists of the present disclosure may include metal oxide nanoparticles, organic and/or inorganic molecules, molecular organometallic materials, or other materials as known in the art and/or described herein. FIG. 3 illustrates an embodiment of a metal complex including a plurality of metallic cores ($M^+$) and associated ligands (L). In some examples, the metal complex may crosslink (e.g., upon exposure to EUV light). In accordance with embodiments of the present disclosure, FIG. 4 illustrates a metal complex including metallic cores (M+), radical generators (R), cross-linker sites (L), as well as other cores (C), which may be organic cores or metallic cores. In some embodiments, the cross-linker sites disclosed herein have carbon double bonds or carbon triple bonds. In some embodiments, upon exposure (e.g., EUV exposure), the metal cores (M+) may absorb EUV photons, the radical generator sites (R) may generate radicals, the cross-linker sites (L) may become active, and the cores (C) may thus cross-link with each other. In accordance with embodiments disclosed herein, FIG. 5 illustrates a metal complex including metallic cores (M+) and radical generators (R) coupled to polymers. In some embodiments, the polymers may cross-link with each other, for example, upon exposure to EUV light and radical generation by the radical generators (R) to induce a cross-linking reaction. In accordance with some embodiments, FIG. 6 illustrates a metal complex including metal oxide clusters coupled to polymers. In various embodiments, the polymers may cross-link with each other, for example, upon exposure to EUV light and radical generation by the metal oxide clusters. As previously noted, the metal oxide clusters may perform a radical generator function, thereby inducing the cross-linking reaction.

FIGS. 7A, 7B, 7C, 7D, 7E, 7F, 7G, 7H, 7I, 7J, 7K, and 7L provide various examples of molecular structures that may be used as part of a metal sensitizer. In some embodiments, the metal sensitizer may include the metal radical generator disclosed herein. In some cases, the metal sensitizer may include the metallic core disclosed herein. In various embodiments, the metal sensitizer is selected to include a high EUV absorption atom such as Cs, Ba, La, Ce, In, Sn, Ag, and/or Sb. In some examples, after EUV exposure, radicals may be generated between the metal core and organic portion, and cross-linking may occur as described above. In some embodiments, a molecular weight of the metal sensitizer is less than about 600. In some cases, the metal sensitizer may be coupled to a polymer such as polystyrene, acrylate, or a 1~10 carbon unit to form a polymer. In some examples, after DUV exposure, radicals may be generated and cross-linking may occur.

Figure 9:
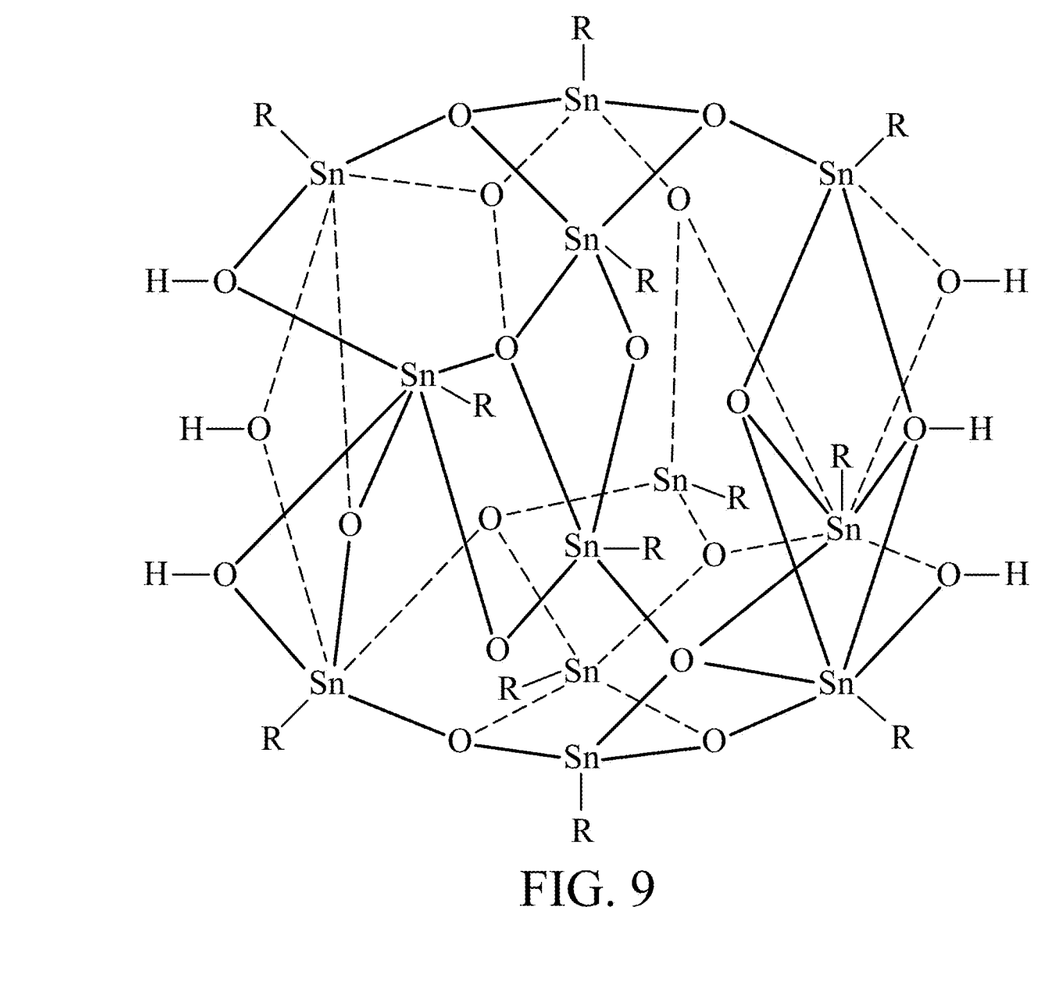
FIG. 9 illustrates an additional embodiment of a structure that may be used as the metallic core and/or metallic cluster, according to some embodiments.
Figure 10A:
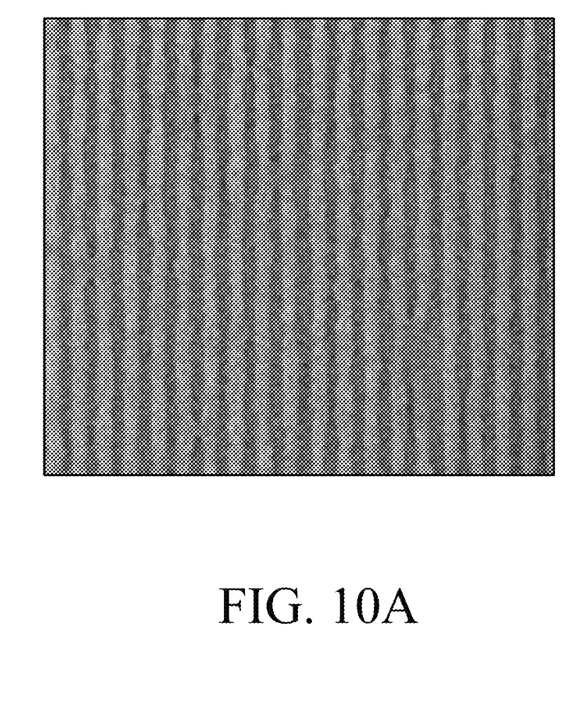
FIGS. 10A and 10B illustrate patterns formed using conventional resist and the metallic resist disclosed herein, respectively, in accordance with some embodiments.
Figure 10B:
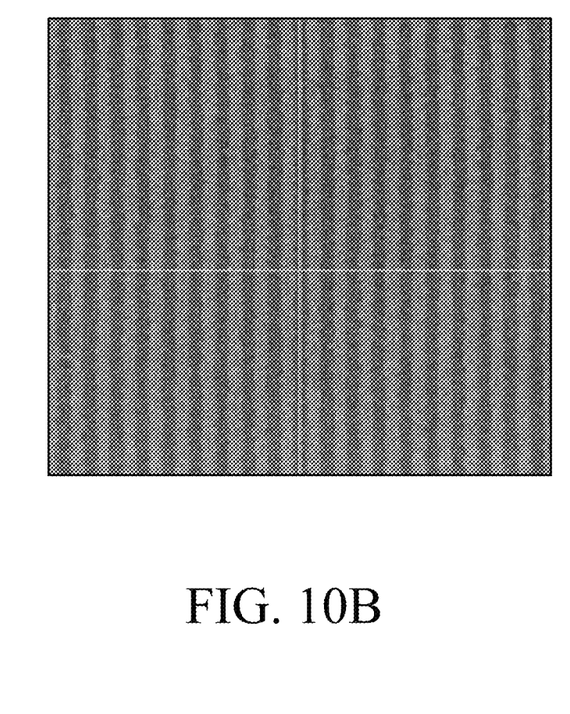

FIGS. 8A, 8B, 8C, 8D, 8E, and 8F provide various examples of molecular structures that may be used as part of the organic core with cross-linker site. In some embodiments, the organic core may include an aromatic carbon ring, straight or cyclic alkyl/alkoxyl/fluoro alkyl/fluoro-alkoxyl chain with a chain of carbon of about 8~60. In some embodiments, the cross-linker site may include a structure having a carbon double or triple bond, such as R(M)-CH= or R(M)-C≡. In some cases, the amount of cross-linker sites is equal to about 2~20. In some embodiments, the organic core with cross-linker may also include some —OH or —COOH to provide polar functionality and to enhance patterning ability. FIG. 9 illustrates an additional embodiment of a structure that may be used, for example, as the metallic core and/or metallic cluster. In some cases, the metallic core and/or metallic cluster of FIG. 9 may be coupled to a polymer, for example, as shown with reference to FIG. 5 and FIG. 6. For purposes of illustration, FIG. 10B illustrates a pattern exhibiting an increased process window that may be achieved by utilizing the metallic resist disclosed herein, for example, as compared to a similar pattern formed utilizing a conventional resist as shown in FIG. 10A.

Additional details of the various resist compositions and metal complexes used for the resist layer 206, as well as additional details of other aspects of various methods and structures (e.g., materials of the structure 200) that may be fabricated in accordance with embodiments of the present disclosure, are now discussed.

For example, some embodiments of the present disclosure provide a method of forming a semiconductor pattern, where the method includes forming a first material layer on a semiconductor substrate, forming a second material layer on top of the first material layer (e.g., where the second material layer is a silicon hardmask), forming a third material layer on top of the second material layer (e.g., where the third material layer is a photoresist), and forming a photoresist pattern by a photolithography process. In some embodiments, the photoresist includes a metallic resist including at least a metallic radical generator, an organic core with one or more cross-linker sites, and an organic solvent. In some examples, the photoresist pattern may be used as an etch mask in a subsequent etching processes, for example to transfer the pattern of the patterned resist layer to an underlying material layer (e.g., to form the semiconductor pattern). Alternatively, the resist pattern may be used as an ion implantation mask in a subsequent ion implantation process applied to the underlying material layer. In some embodiments, the first material layer has a different optical property compared to the silicon hardmask and the photoresist. In some cases, the first material layer has a substantially different n, k or T value compared to the photoresist. In various embodiments, the first material layer includes at least one of a different polymer structure, acid-labile molecule, photoacid generator (PAG) loading, quencher loading, chromophore, cross linker, or solvent, which leads to a different n value compared to the photoresist. In some embodiments, the first material layer, the second material layer (e.g., the silicon hardmask), and the photoresist have different etch resistances. In some cases, the first material layer or the photoresist contain at least one etching resistance molecule. By way of example, the etching resistance molecule may include a low onishi number structure, a double bond, a triple bond, silicon, silicon nitride, Ti, TiN, Al, aluminum oxide, or SiON, among others. In some embodiments, the semiconductor substrate is substantially conductive or semi-conductive with the electric resistance less than $10^3$ ohm-meter. In some examples, the semiconductor substrate may include a metal, a metal alloy, and/or metal nitride/sulfide/selenide/oxide/silicide with the formula $MX_a$, where M is a metal and X is N, S, Se, O, or Si with a=0.4~2.5. For example, Ti, Al, Co, Ru, TiN, WN2, TaN. In some embodiments, the semiconductor substrate includes a dielectric having a dielectric constant in a range from about 1 to 40. In various embodiments, the semiconductor substrate may include Si, a metal oxide and a metal nitride, in accordance with the formula is $MX_b$, where M is a metal or Si, and X is N or O with b=0.4~2.5. For example, $SiO_2$, silicon nitride, aluminum oxide, hafnium oxide, lanthanum oxide.

Additionally, in some examples, embodiments of the present disclosure provide a method of forming a semiconductor pattern, where the method includes forming a first material layer on a semiconductor substrate, forming a second material layer on top of the first material layer (e.g., where the second material layer is a silicon hardmask), forming a third material layer on top of the second material layer (e.g., where the third material layer is a photoresist), and forming a photoresist pattern by photolithography. In some examples, the photoresist pattern may be used as an etch mask in a subsequent etching processes, for example to transfer the pattern of the patterned resist layer to an underlying material layer (e.g., to form the semiconductor pattern). Alternatively, the resist pattern may be used as an ion implantation mask in a subsequent ion implantation process applied to the underlying material layer. In some examples, the second material layer may include a silicon-containing polymer, a crosslinker, a chromophore, a PAG, a quencher (base), a fluoro additive, and/or a solvent. In some embodiments, the second material layer may have a different optical property compared to the first material layer and the photoresist. In some cases, the second material layer has a substantially different n, k or T value compared to the first material layer and the photoresist. In various embodiments, the second material layer may include at least one of a different silicon-containing polymer structure, an acid-labile molecule, PAG loading, quencher loading, a chromophore, a cross linker, and/or a solvent, which may lead to a different n value compared to the photoresist. In some embodiments, the first material layer, the second material layer (e.g., the silicon hardmask), and the photoresist have different etch resistances. In some cases, the second layer includes at least one etching resistance molecule. By way of example, the etching resistance molecule may include a low onishi number structure, a double bond, a triple bond, silicon, silicon nitride, Ti, TiN, Al, aluminum oxide, or SiON, among others.

As discussed above, embodiments of the present disclosure provide a photoresist that includes a metallic resist including at least a metallic radical generator, an organic core with one or more cross-linker sites, and an organic solvent. In some embodiments, the metallic resist is within a metallic radical generator which could be a single metal molecular, or metal cluster with radical generator function. In some embodiments, the weight ratio of the metallic radical generator to the solvent (e.g., organic solvent) would be about 1%~20%. For the cation core, the metal is selected to be a high EUV absorption atom such as Cs/Ba/La/Ce/In/Sn/Ag/Sb. In some embodiments, after EUV exposure, radicals are generated between the metal core and the organic portion of the metallic resist. In some embodiments, the molecular weight of the metallic radical generator is less than about 600. In some embodiments, the metal sensitizer could be connected to a polymer. In some cases, after DUV or EUV exposure, radicals are generated and induce the cross-linking process, thereby making the metallic resist non-soluble where it has been exposed. In some cases, the metallic resist includes the organic core having at least one cross-linker site, where a weight ratio of the organic core to the solvent may be around 3%~35%. In some embodiments, the disclosed resist may include a metallic core within the cross-linker site and/or within the radical generator site. By way of example, a weight ratio of the metallic core to the solvent may be around 3%~30%. In some embodiments, after exposure of the metallic resist (e.g., including a DUV or EUV exposure with a wavelength <100 nm), the metallic radical generator may generate radicals to induce a cross-linking reaction. By way of example, the organic core may thus become cross-linked and un-soluble, while non-exposed portions of the resist may be soluble in a developer. In some embodiments, the developer system may include NTD resist, so there may be a hybrid NTD CAR resist in the disclosed metallic resist to optimize performance such as LWR and exposure energy. In some cases, a ratio of the NTD CAR resist to the disclosed metallic resist is less than about 50%. In some embodiments, the metallic resist disclosed herein may be applied to processes having a pattern pitch of less than about 40 nm. In some cases, the LWR and exposure energy for the disclosed resist may be about less than 5 nm and less than 40 mJ, respectively. In some embodiments, the organic core of the metallic resist may include an aromatic carbon ring, straight or cyclic alkyl/alkoxyl/fluoro alkyl/fluoroalkoxyl chain with a chain of carbon of about 8~60. In some embodiments, the cross-linker site may include a structure having a carbon double or triple bond, such as R(M)-CH= or R(M)-C≡. In some cases, the amount of cross-linker sites is equal to about 2~20. In some embodiments, the organic core with cross-linker may also include some —OH or —COOH to provide polar functionality and to enhance patterning ability.

The various embodiments described herein offer several advantages over the existing art. It will be understood that not all advantages have been necessarily discussed herein, no particular advantage is required for all embodiments, and other embodiments may offer different advantages. As one example, embodiments discussed herein include methods to improve resist performance by using lithographic light sources (e.g., EUV light) more efficiently. For example, in some embodiments, a novel metallic resist (e.g., such as an EUV resist) is provided, where the metallic resist provides for improved light absorption (e.g., EUV light absorption) of the resist. In some embodiments, the metallic resist disclosed herein includes at least a metallic radical generator, an organic core with one or more cross-linker sites, and an organic solvent. In some examples, the disclosed resist includes the metallic radical generator which could be a single metal molecule, or a metal cluster with a radical generator function. In some embodiments, a weight ratio of the metallic radical generator to the solvent may be around 1%~20%. In some cases, the disclosed resist includes the organic core having at least one cross-linker site, where a weight ratio of the organic core to the solvent may be around 3%~35%. In some embodiments, the disclosed resist may include a metallic core within the cross-linker site and/or within the radical generator site. By way of example, a weight ratio of the metallic core to the solvent may be around 3%~30%. In some embodiments, the metallic resist disclosed herein includes an organic solvent such as one of the solvents described above. In some embodiments, after exposure of the metallic resist, the metallic radical generator may generate radicals to induce a cross-linking reaction. By way of example, the organic core may thus become cross-linked and un-soluble, while non-exposed portions of the resist may be soluble in a developer. In some embodiments, the metallic resist disclosed herein may be applied to processes having a pattern pitch of less than about 40 nm. Thus, embodiments of the present disclosure serve to overcome various shortcomings of at least some current resist compositions and methods.

Thus, one of the embodiments of the present disclosure described a method that includes providing a substrate and forming a resist layer over the substrate. In various embodiments, the resist layer includes a metal complex including a radical generator, an organic core, and an organic solvent. By way of example, the organic core includes at least one cross-linker site. In some embodiments, an exposure process is performed to the resist layer. After performing the exposure process, the exposed resist layer is developed to form a patterned resist layer.

In another of the embodiments, discussed is a method where a first material layer is deposited on a semiconductor substrate. Thereafter, in some embodiments, a second material layer is formed on the first material layer. In some cases, the second material layer includes a silicon hardmask. In various examples, a third material layer is then formed on the second material layer, where the third material layer includes a photoresist. In some embodiments, the photoresist includes a metal complex including a radical generator, an organic core, and an organic solvent. In some embodiments, a photoresist pattern is then formed, for example, by a photolithography process.

In yet another of the embodiments, discussed is a method of semiconductor device fabrication including providing a substrate and forming a resist layer over the substrate, where the resist layer includes a metal complex. In various embodiments, the metal complex includes a radical generator, an organic core, and an organic solvent, and the organic core includes at least one cross-linker site. In some cases, an exposure process is performed to the resist layer, where the exposure process is performed using an EUV light source and projected onto the resist layer through an intervening mask that includes a circuit pattern. In some cases, the circuit pattern includes one or more FinFET device circuit patterns. In various embodiments, after performing the exposure process, the exposed resist layer is developed to form a patterned resist layer, where the patterned resist layer includes the circuit pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a substrate;
forming a first material layer over the substrate, wherein the first material layer has a first optical constant value and a first etch resistance;
after forming the first material layer, depositing a second material layer over the first material layer, wherein the second material layer includes a Si hardmask, and wherein the second material layer has a second optical constant value and a second etch resistance;
after depositing the second material layer, forming a resist layer over the second material layer, wherein the resist layer includes a metal complex including a radical generator, an organic core, and an organic solvent, wherein the organic core includes at least one cross-linker site, wherein the radical generator includes a molecular structure having a high EUV absorption atom and a plurality of methyl groups, wherein the resist layer has a third optical constant value and a third etch resistance, wherein the first optical constant value is different than each of the second and third optical constant values, and wherein each of the first, second, and third etch resistances are different;
after forming the resist layer, performing an exposure process to the resist layer to generate radicals by the radical generator, activate the at least one cross-linker site, and cross-link the metal complex to another metal complex;
after performing the exposure process, developing the exposed resist layer to form a patterned resist layer having first openings that expose the Si hardmask;
after forming the patterned resist layer, etching the Si hardmask through the first openings in the patterned resist layer to form a patterned Si hardmask layer having second openings that expose the first material layer; and
after forming the patterned Si hardmask layer, etching the first material layer through the second openings in the patterned Si hardmask layer to form fin-like active regions.

2. The method of claim 1, wherein the radical generator is part of a metallic core, and wherein the metallic core is one of a single metal molecule and a metal cluster having a radical generator function.

3. The method of claim 2, wherein a weight ratio of the metallic core to the organic solvent is around 3%-30%.

4. The method of claim 1, wherein a weight ratio of the radical generator to the organic solvent is around 1%-20%.

5. The method of claim 1, wherein a weight ratio of the organic core to the organic solvent is around 3%-35%.

6. The method of claim 1, wherein the radical generator includes the high EUV absorption atom including one of Cs, Ba, La, Ce, In, Sn, Ag, and Sb.

7. The method of claim 6, wherein the Ba of the high EUV absorption atom includes a $Ba^{2+}$ ion.

8. The method of claim 1, wherein the radical generator is coupled to a polymer including one of polystyrene, acrylate, and a 1-10 carbon unit.

9. The method of claim 1, wherein the organic core includes one of an aromatic carbon ring, a straight or cyclic alkyl/alkoxyl/fluoro alkyl/fluoroalkoxyl chain with a chain of carbon of about 8-60.

10. The method of claim 1, wherein the at least one cross-linker site includes a structure having one of a carbon double bond and a carbon triple bond.

11. The method of claim 10, wherein the structure having the one of the carbon double bond and the carbon triple bond includes R(M)-CH= and R(M)-C≡.

12. The method of claim 1, wherein the patterned resist layer is completely consumed during the etching the Si hardmask through the first openings in the patterned resist layer to form the patterned Si hardmask layer.

13. A method, comprising:
depositing an absorber layer on a transparent mask substrate, wherein the absorber layer includes a chromium layer, and wherein the transparent mask substrate includes quartz;
after depositing the absorber layer on the transparent mask substrate, forming an adhesion layer on the absorber layer, wherein the adhesion layer includes an HMDS layer;
after forming the adhesion layer, forming a photoresist layer over the adhesion layer, wherein the photoresist layer includes a first metal complex including a first metallic core having a radical generator, a first organic core, and an organic solvent;
after forming the photoresist layer, patterning the photoresist layer using a first photolithography process to provide a patterned photoresist layer having openings that expose the absorber layer;
after forming the patterned photoresist layer, patterning the absorber layer through the openings in the patterned photoresist layer to provide a patterned absorber layer on the transparent mask substrate, wherein the patterned absorber layer defines a circuit pattern, and wherein the patterned absorber layer and the transparent mask substrate provides an EUV mask; and
patterning, by a second photolithography process, a semiconductor substrate using the EUV mask, wherein the second photolithography process transfers the circuit pattern to the semiconductor substrate.

14. The method of claim 13, wherein the first metallic core is one of a single metal molecule and a metal cluster having a radical generator function.

15. The method of claim 13, wherein patterning the photoresist layer further includes performing an exposure process to the photoresist layer to cross-link the first metallic core of the first metal complex to a second organic core of a second metal complex by a first cross-linker site.

16. The method of claim 15, wherein patterning the photoresist layer further includes performing the exposure process to the photoresist layer to cross-link the first organic core of the first metal complex to a second metallic core of the second metal complex by a second cross-linker site.

17. A method of semiconductor device fabrication, comprising:

providing a substrate;

forming a hybrid resist layer over the substrate, wherein the hybrid resist layer includes both a negative tone development (NTD) chemically amplified resist and a metallic resist, wherein the metallic resist includes a metal complex including a radical generator, an organic core, and an organic solvent, wherein the organic core includes at least one cross-linker site, wherein the radical generator includes a high EUV absorption atom, and wherein the hybrid resist layer includes a greater amount of the metallic resist as compared to the NTD chemically amplified resist;

performing an exposure process to the hybrid resist layer, wherein the exposure process is performed using an EUV light source and projected onto the hybrid resist layer through an intervening mask including a circuit pattern; and after performing the exposure process, developing the exposed hybrid resist layer to form a patterned hybrid resist layer, wherein the patterned hybrid resist layer includes the circuit pattern.

18. The method of claim 17, wherein the radical generator includes the high EUV absorption atom including one of La, Ce, In, Sn, Ag, and Sb, and wherein the organic core includes one of an aromatic carbon ring, a straight or cyclic alkyl/alkoxyl/fluoro alkyl/fluoroalkoxyl chain with a chain of carbon of about 8-60.

19. The method of claim 17, wherein the organic solvent includes one or more of PGMEA (Propylene glycol methyl ether acetate), PGME (propylene glycol monomethyl ether), PGEE (1-Ethoxy-2-propanol), GBL (Gamma-Butyrolactone), CHN (Cyclohexanone), EL (Ethyl lactate), Methanol, Ethanol, Propanol, n-Butanol, Acetone, DMF (Dimethylformamide), IPA (Isopropyl alcohol), THF (Tetrahydrofuran), and Methyl Isobutyl Carbinol (MIBC).

20. The method of claim 17, wherein the circuit pattern includes one or more circuit patterns having a pattern pitch of less than about 40 nm.

* * * * *